Oct. 4, 1960

G. A. SILVEY 2,955,269

SEMICONDUCTOR CIRCUIT ELEMENTS

Filed May 22, 1957

*INVENTOR.*
GENE A. SILVEY

*BY* Harry T. Berriman

AGENT

United States Patent Office 2,955,269

Patented Oct. 4, 1960

2,955,269

SEMICONDUCTOR CIRCUIT ELEMENTS

Gene A. Silvey, Elizaville, N.Y., assignor to International Business Machines Corporation, New York, N.Y., a corporation of New York Filed May 22, 1957, Ser. No. 660,810

1 Claim. (Cl. 338—15)

This invention relates to semiconductor circuit elements and more particularly to semiconductor circuit elements wherein the semiconductor material is zinc diarsenide ($ZnAs_2$)

The performance of any particular semiconductor circuit element is determined principally by the inherent properties of the semiconductor material from which it is fabricated. Two of the principal properties of a semiconductor material are the energy gap width and the mobility of the carriers. These two properties may vary differently with respect to each other under the influence of biasing potentials and temperature conditions for each particular semiconductor material. In many cases these properties are of such a nature that, in a given semiconductor device, a condition employed to avoid an undesirable effect due to one property of the semiconductor material, frequently will serve to aggravate an undesirable effect due to another property. It is thus evident that the evolvement of a unique semiconductor material, permits the construction of semiconductor devices having corresponding properties, such devices being accordingly adapted for application in circuit applications wherein the unique properties are desirable. If the new semiconductor material is also easily prepared, unique semiconductor devices at a reasonable cost are possible.

It has been discovered that the compound zinc diarsenide ($ZnAs_2$) may be given semiconductor properties by purifying to a degree suitable for semiconductor use and then introducing therein appropriate impurities so that the compound will exhibit N-type or P-type conductivity, as required. This semiconductor zinc diarsenide ($ZnAs_2$) is easily synthesized in comparison to the difficult procedures required to obtain silicon semiconductor material for example. The semiconductor zinc diarsenide may be used in the fabrication of semiconductor devices and such devices will have inherent properties different from the properties of semiconductor devices constructed from previous known semiconductor materials.

It is accordingly the primary object of the invention to provide a zinc diarsenide ($ZnAs_2$) semiconductor device.

Another object is to provide a zinc diarsenide rectifier.

Another object is to provide a zinc diarsenide photo sensitive device.

Still a further object is to provide a zinc diarsenide infrared filter.

Another object is to provide a zinc diarsenide transistor device.

Another object of the invention is to provide a circuit component which utilizes the electrical anisotropy property of semiconductor zinc diarsenide.

Other objects of the invention will be pointed out in the following description and claim and illustrated in the accompanying drawings, which disclose, by way of example, the principle of the invention and the best mode, which has been contemplated, of applying that principle.

Figure 1:
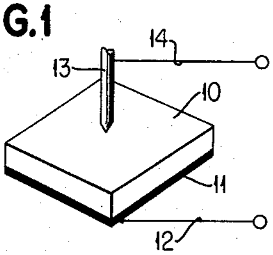
Figure 1 is a point contact rectifier utilizing semiconductor zinc diarsenide ($ZnAs_2$) as the body material.

The zinc diarsenide compound has been found to be a subliming solid having a melting point in the vicinity of 771 degrees centigrade at a pressure of approximately 50 lbs. per square inch. The energy gap width of semiconductor zinc diarsenide is .95 electron volt. The zinc diarsenide compound can be made to exhibit N-type or P-type conductivity by the introduction therein of appropriate conductivity directing impurities. The elements of group *1b* of the periodic table, namely copper, silver and gold have been found to be among those elements that can produce P-type conductivity, and the elements of group *6a* of the periodic table, namely sulfur, selenium and tellurium have been found to be among those elements that can produce N-type conductivity in zinc diarsenide.

In order to be suitable for all semiconductor applications the zinc diarsenide material should have a high degree of purity, a specific resistivity within a range sufficient to give suitable efficiency to the various parameters of the device made therefrom, and have a sufficiently small number of carrier traps so that carrier recombination in the material does not prevent transistor action. The above requirements are general and take on different degrees of importance depending on the performance expected from the semiconductor device. For example, in a simple rectifier the absence of carrier traps is not of great importance whereas in transistors and photocells all three requirements have a definite effect on performance. These requirements are all well known in the art.

The zinc diarsenide material may be provided in any manner that will yield material having the requisite purity, resistivity and absence of carrier traps necessary for performance in a particular semiconductor device. The following description of a method of providing semiconductor zinc diarsenide is provided to aid in understanding and practicing the invention, it being understood that the invention should not be limited to a particular process for, as will be apparent from the following description, many variations in the process are available to one skilled in the art in forming the material. In any process employed, the steps of the process will be directed toward providing zinc diarsenide ($ZnAs_2$) with the requisite purity and resistivity. For this reason the zinc and the arsenic are very highly purified when reacted and the environment is very closely controlled at each step in the process.

The zinc has physical properties such that it may readily be purified by the technique known in the art as zone refining. The arsenic, however, is a subliming solid and as such requires pressures for melting that at present would make a zone refining operation difficult. The arsenic may be partially purified by fractional sublimation and through this process impurities having vapor pressures above and below the range of arsenic may be removed. The remaining impurities in the arsenic may be removed by zone refining the zinc diarsenide compound in a manner to be later described. It should be noted that in semiconductor material the presence of one impurity atom to ten million atoms is sufficient to affect performance, hence any methods used for purification and environment control should be capable of maintaining this type of purity. It has been established in the art that carrier traps are at a minimum in single crystals of a semi-conductor material. It is for this reason that an effort is made in the process of providing the material to cause the material to assume the physical form of a single crystal suitable for semi-conductor device fabrication.

The compound zinc diarsenide may be prepared in the following manner. Stoichiometric quantities of highly purified zinc as resulting from zone refining and oxide free arsenic of an amount .1% in excess over the stoichiometric quantity to compensate for the difference in vapor pressure in materials, are contained in a graphite boat. The boat is then sealed in a quartz tube containing argon at a pressure in the vicinity of 600 mm. of mercury. The quartz tube is then heated to a temperature of about 800 degrees centigrade in a suitable manner thereby effecting synthesis of zinc diarsenide. The argon pressure over the compound at this temperature is approximately 2.1 atmospheres. The resulting zinc diarsenide is now purified to further remove the impurities present in the constituents or acquired from the environment during the reaction.

This may be accomplished by placing the quartz tube, still in its sealed condition, in a furnace which is maintained at a temperature in a range of 700 degrees centigrade. The furnace has 3 zone heaters separated 3" apart and the zinc diarsenide as contained in the quartz tube is slowly pulled through the furnace and the 3 zone heaters. The portion of the zinc diarsenide adjacent to each zone heater becomes molten and as the tube is moved relative to the heaters, the molten zone passes along the zinc diarsenide ingot. As each molten zone moves along the ingot, the impurities are carried therewith and deposited at the tail of the ingot. After 6 to 9 molten zones have been passed through the ingot, which would require 2 to 3 complete passes of the ingot past the zone heaters, the leading portion of the ingot will be sufficiently pure for semiconductor use. This zone refining technique is well known in the art. At the end of the zone refining operation, the zinc diarsenide ingot is removed from the quartz tube and the tail portion and the ingot containing the massed impurities is cut off and discarded. The appropriate type and concentration of impurities may now be introduced into the zinc diarsenide so as to provide a desired conductivity type and resistivity in the material. It has also been found advantageous to carefully heat treat the zinc diarsenide to remove thermal stresses which are a source of carrier traps and permit large single crystals to form.

The impurity introduction and the heating treatment may be accomplished in a single temperature cycle. This may be effected by heating the zinc diarsenide under pressure in the presence of the impurity and distributing the impurity when the zinc diarsenide is in a molten state by suitable agitation. The molten material is then slowly cooled until it solidifies. When the sample has cooled, a single large crystal or several large single crystals are achieved which may then be cut so as to provide monocrystalline bodies for semiconductor devices.

Figure 2:
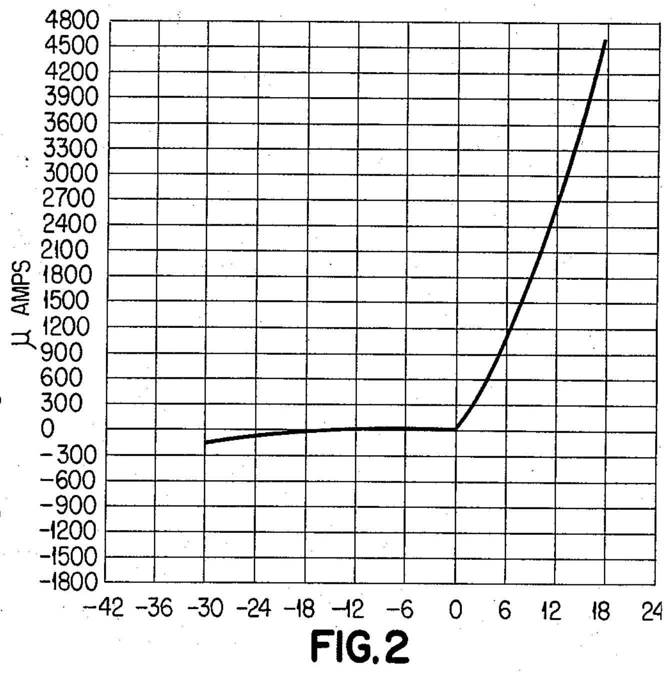
Figure 2 is a graph illustrating a representative voltage current characteristics of a P-type semiconductor rectifier fabricated of semiconductor ($ZnAs_2$) in accordance with this invention.

The zinc diarsenide semiconductor material may be employed in the manufacture of a wide variety of semiconductor devices. Referring now to Fig. 1 there is shown a diode point contact rectifier comprising a body 10 of zinc diarsenide having an ohmic contact 11 of solder or other suitable material to which there is attached a terminal and lead 12 for external connection. A suitable point contact 13 of tungsten, or Phosphor bronze, for example, makes rectifying contact with the body 10. A terminal and lead 14 are attached to the point contact 13 for external connection. With a diode as shown in Fig. 1 fabricated with a zinc diarsenide body 10 of P-type conductivity and having a resistivity of 400 ohm centimeters, and with potentials as indicated along the abscissa of Fig. 2 applied between the leads 12 and 14 of the rectifier from any suitable source (not shown), an output characteristic curve as shown in Fig. 2 was obtained. The above described diode was found to have a forward resistance of 2.9K ohms and a back resistance of .12 megohms.

Figure 3:
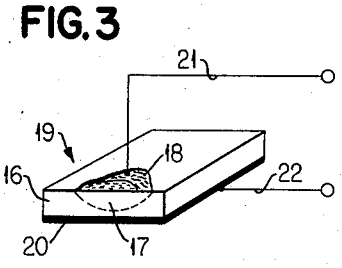
Figure 3 is a junction rectifier utilizing semiconductor zinc diarsenide as the body material.

Referring now to Fig. 3 there is shown a junction diode comprising a body 16 of semiconductor zinc diarsenide of a particular conductivity type such as P-type, for example. A region of opposite type conductivity 17 such as N-type, for example, and forming a junction barrier 18 is alloyed into the body 16 by applying a quantity of an appropriate conductivity directing impurity 19 such as tellurium, and heating until the impurity 19 fuses into the body 16 to form the junction 18. Ohmic contact 20 and external connection terminals and leads 21 and 22 are then applied in the same manner as for the diode shown in Fig. 1.

Figure 4:
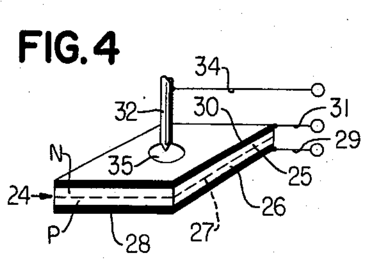
Figure 4 is a junction emitter point contact collector transistor having a body of semiconductor zinc diarsenide.

Referring now to Fig. 4, a junction emitter point contact collector transistor is shown to illustrate the application of both point contact and junction fabrication techniques in the formation of semiconductor devices made from the semiconductor material zinc diarsenide. In Fig. 4, there is provided a body portion 24 of semiconductor zinc diarsenide having two zones of opposite type conductivity N and P, respectively 25 and 26, which are separated by a barrier 27. The body portion may be fabricated, for example, by taking semiconductor zinc diarsenide of one conductivity type and forming therein a region of opposite type conductivity by maintaining the body at an appropriate temperature in the presence of an environment containing a vapor of an opposite conductivity directing impurity until the opposite type conductivity directing impurity diffuses into the body to provide a junction barrier 27 therein. Unnecessary material may be removed and an ohmic connection 28 and associated external connection 29 may be attached to zone 26 which may serve as the emitter of the transistor. A further ohmic connection 30 may be made to zone 25 and an external connection 31 may be provided so that zone 25 may serve as the base of the transistor. A point contact 32 with an external connection 34 may be applied to zone 25 through an aperture 35 provided in the ohmic connection 30, this connection may then serve as the collector of the transistor. The technique of electroforming established in the art may be applied to the collector 32 to increase amplification and yield other benefits if desired.

As may be seen from the above discussion, the semiconductor zinc diarsenide material may be used to provide a wide variety of semiconductor devices of which Figs. 1, 3 and 4 are examples. Further, each such device when subjected to light frequencies is both photoconductive and photovoltaic, the output signal being delivered directly or amplified depending on the type of electrodes applied and the electrode geometry of the particular device.

Figure 5:
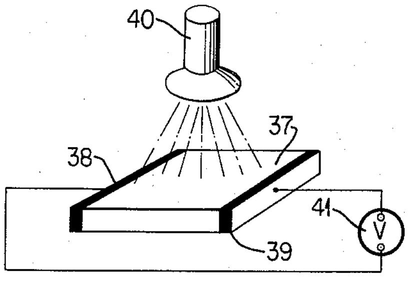
Figure 5 is an infrared filter having a body of semiconductor zinc diarsenide.
Figure 6:
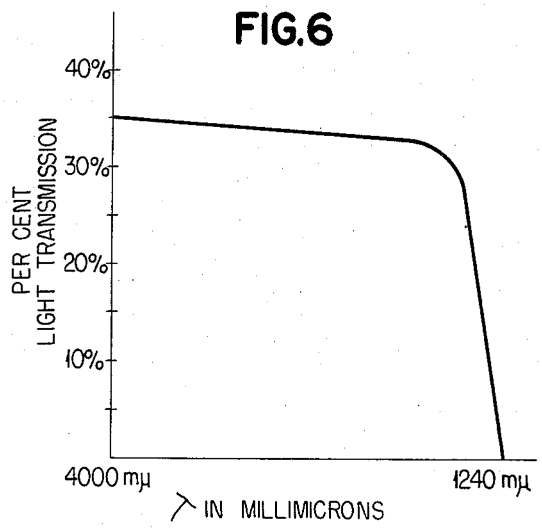
Figure 6 is a graph showing the light transmission of the semiconductor zinc diarsenide material.

Semiconductor zinc diarsenide has also been found to act as a filter for infrared energy. Referring now to Fig. 5, an illustration of an infrared energy filter is shown wherein a body of zinc diarsenide 37 is provided with spaced ohmic contacts 38 and 39. Light as from a source 40 impinging on the semiconductor device body 37 is transmitted down to the shorter infrared wavelengths indicated at the right in Fig. 6. With an application of electromagnetic radiation at these latter infrared wave lengths to the body portion 37, an indicating means shown as a meter 41 connected between ohmic contacts 15 and 16 by suitable leads would indicate an abrupt increase in the amount of energy absorbed by the semiconductor zinc diarsenide body 37. This action is fully evident from the graph of Fig. 6 which illustrates the variation of the percentage of light transmitted by the body 37 with variation of the wavelength of the transmitted energy from source 17. It should be noted that the curve is fairly flat in the long wavelength region with a sharp cutoff being observed at a wavelength of the shorter wavelengths of the infrared region and that no transmission takes place at the wavelengths below the range of 1240 millimicrons, as indicated. Consequently, an effective infrared filter may be provided by using a sheet of semiconductor zinc diarsenide of the desired area dimension to cover the light source and having a thickness dimension such that the desired quantity of long wavelength light is transmitted. In a particular example a sheet of semiconductor zinc diarsenide approximately .005 inch thick was found to transmit approximately 35% of the impinging light, down to the infrared wavelengths indicated to the right in the graph of Fig. 6. The light transmission figure of 35% indicated above and in Fig. 6 is only representative and applied to the particular sample sheet of zinc diarsenide described. The percentage light transmissions varies not only in correspondence with the thickness of the sheet of semiconductor zinc diarsenide but also in relation to the surface treatment applied to the sheet. The percentage figure of 35 is accordingly not to be considered either an upper or lower limit as to the light transmission of the semiconductor zinc diarsenide.

Figure 7:
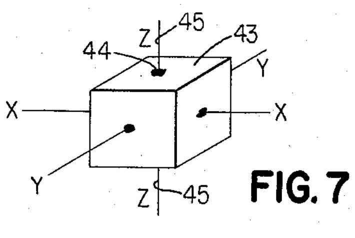
Figure 7 is a circuit element fabricated of a cube of semiconductor zinc diarsenide in a manner so as to utilize the electrical anisotropy characteristic of the semiconductor material.

The semiconductor zinc diarsenide has also been found to exhibit electrical anisotropy, that is the magnitude of the specific resistivity of the material varies with respect to each of the three crystallographic axes. The maximum ratio of resistivity value along one axis with respect to another is approximately two. Referring now to Fig. 7 there is shown a representative circuit element constructed of semiconductor zinc diarsenide and which utilizes the electrical anisotropy characteristic. The element comprises a cube 43 of semiconductor $ZnAs_2$ which is cut from a single crystal of this material so that the cubic axes are substantially aligned with crystallographic axes of the single crystal. An ohmic connection 44 with suitable electrical lead 45 is then made to each of the six crystal faces as indicated. The leads 45 linked to each pair of opposite faces of the cube are further labeled X—X, Y—Y, and Z—Z as indicated since they provide a circuit path through the cube corresponding to the related X, Y or Z axis thereof. Each of these axis aligned circuit paths has a distinct specific resistivity that differs from the specific resistivity of either one or the other two axis aligned circuit paths. The leads X—X, Y—Y, Z—Z are linked to suitable external circuitry as desired.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention therefore to be limited only as indicated by the following claim.

What is claimed is:

An infrared filter device comprising a sheet of semiconductor material having zinc diarsenide ($ZnAs_2$) as a major constituent in a concentration of greater than 99 percent and a minor constituent of at least one conductivity directing impurity in a concentration less than one percent, a first ohmic connection member secured to said sheet along one edge thereof, and a second ohmic connection member secured to said sheet along another edge thereof directly opposite to said first ohmic connection.

References Cited in the file of this patent

UNITED STATES PATENTS 1,745,723 Snelling ---------------- Feb. 4, 1930

OTHER REFERENCES

Semiconductor Properties of $ZnAs_2$; by C. Fritzsche, Annalen der Physik, vol. 17, pages 94 to 101. Published in 1955 by Johann Ambrosius Barth, Leipzig, Germany.